(12) United States Patent
Huang et al.

(10) Patent No.: US 9,608,195 B2
(45) Date of Patent: Mar. 28, 2017

(54) MAGNETIC TUNNEL JUNCTION DEVICE

(71) Applicant: Taiwan Semiconductor Manufacturing Company, Ltd., Hsin-Chu (TW)

(72) Inventors: Wei-Hang Huang, Kaohsiung (TW); Chern-Yow Hsu, Chu-Bei (TW); Shih-Chang Liu, Alian Township (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/820,820

(22) Filed: Aug. 7, 2015

(65) Prior Publication Data

US 2015/0340596 A1 Nov. 26, 2015

Related U.S. Application Data

(62) Division of application No. 14/013,943, filed on Aug. 29, 2013, now Pat. No. 9,142,761.

(51) Int. Cl.
*H01L 43/12* (2006.01)
*H01L 43/02* (2006.01)
*H01L 43/08* (2006.01)
*H01L 43/10* (2006.01)

(52) U.S. Cl.
CPC .............. *H01L 43/02* (2013.01); *H01L 43/08* (2013.01); *H01L 43/12* (2013.01); *H01L 43/10* (2013.01)

(58) Field of Classification Search
CPC ......... H01L 43/12; H01L 43/02; H01L 43/08; H01L 43/10; Y10T 29/49052; Y10T 29/49046; Y10T 29/49039; Y10T 29/49034; Y10T 29/49043; G11B 5/3903; B82Y 40/00; B82Y 25/00; H01F 41/302
USPC .................... 438/3; 365/33, 50, 97; 257/421
See application file for complete search history.

(56) References Cited

U.S. PATENT DOCUMENTS

| | | | |
|---|---|---|---|
| 2005/0214953 A1* | 9/2005 | Lee | H01L 43/12 438/3 |
| 2010/0003767 A1* | 1/2010 | Cho | H01L 43/08 438/3 |
| 2010/0311243 A1 | 12/2010 | Mao | |
| 2011/0189796 A1 | 8/2011 | Lu et al. | |
| 2013/0302912 A1* | 11/2013 | Zhong | H01L 43/08 438/3 |
| 2014/0042567 A1* | 2/2014 | Jung | H01L 43/08 257/421 |

* cited by examiner

*Primary Examiner* — Thomas L Dickey
*Assistant Examiner* — Changyun Yi
(74) *Attorney, Agent, or Firm* — Slater Matsil, LLP

(57) ABSTRACT

A device includes creating an opening in a dielectric layer that is disposed over a bottom electrode layer. A top electrode layer is disposed over the dielectric layer. A magnetic tunnel junction (MTJ) layer is formed in the opening over the bottom electrode layer.

20 Claims, 7 Drawing Sheets

MAGNETIC TUNNEL JUNCTION DEVICE

This application is a divisional application of U.S. application Ser. No. 14/013,943, filed on Aug. 29, 2013, entitled "Method for Fabricating a Magnetic Tunnel Junction Device," which application is hereby incorporated herein by reference.

TECHNICAL FIELD

The present disclosure relates generally to an integrated circuit and more particularly a magnetic tunnel junction (MTJ) device.

BACKGROUND

An MTJ device includes multiple layers to store "0" and "1" signals for a memory device depending on magnetization directions of a free-layer and a pinned layer that results in different magnetic reluctance. For the MTJ device to have good performance, keeping the MTJ film free from by-product, plasma damage, and oxidation is a challenging issue.

BRIEF DESCRIPTION OF THE DRAWINGS

Reference is now made to the following descriptions taken in conjunction with the accompanying drawings, in which.

DETAILED DESCRIPTION

Figure 1A:
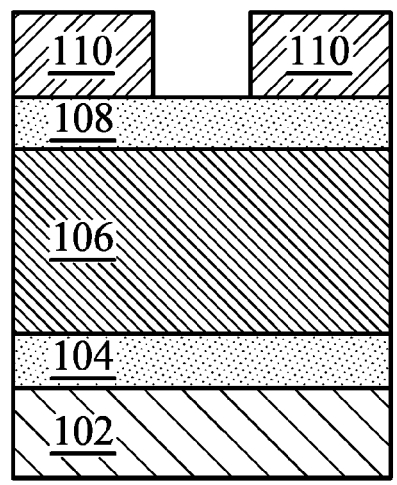
FIGS. 1A-1I are exemplary intermediate fabrication steps an exemplary MTJ device according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIGS. 1A-1I are exemplary intermediate fabrication steps an exemplary MTJ device according to some embodiments. In FIG. 1A, a substrate 102 is shown with a bottom electrode layer 104, a dielectric layer 106, a top electrode layer 108, and a photoresist layer 110 disposed over the substrate 102. The substrate 102 comprises silicon, silicon dioxide, aluminum oxide, sapphire, germanium, gallium arsenide (GaAs), an alloy of silicon and germanium, indium phosphide (InP), silicon on insulator (SOI), or any other suitable material.

In some embodiments, the bottom electrode layer 104 has a thickness ranging from 150 Å to 200 Å, the top electrode layer 108 has a thickness ranging from 300 Å to 350 Å, and the bottom electrode layer 104 and the top electrode layer 108 comprise Ta. The dielectric layer 106 has a thickness ranging from 300 Å to 400 Å, and comprises $SiO_2$, SiN, or any other suitable material. The photoresist 110 is patterned on the top electrode layer 108 by a photolithography process.

Figure 1B:
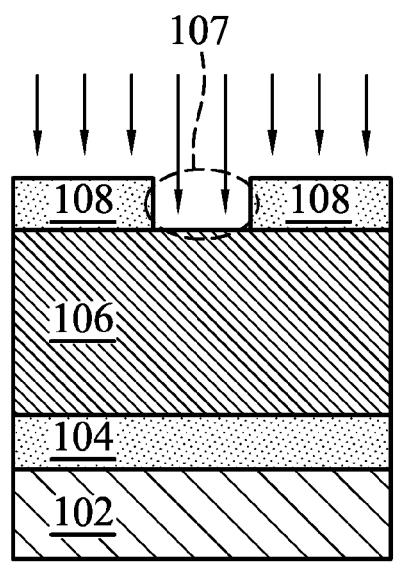

In FIG. 1B, the top electrode layer 108 is etched to form an opening 107 by dry etching for example. In some embodiments, the opening 107 has a width ranging from 40 nm to 50 nm.

Figure 1C:
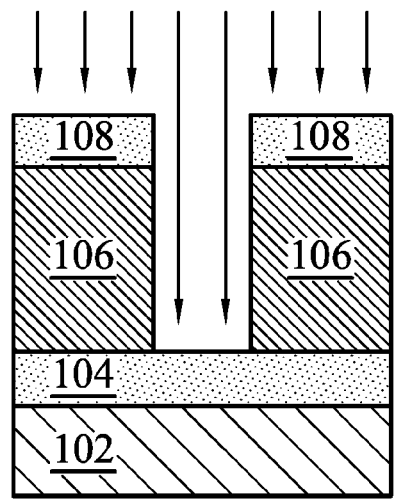

In FIG. 1C, the dielectric layer 106 is etched by dry etching, for example. This step is optional.

Figure 1D:
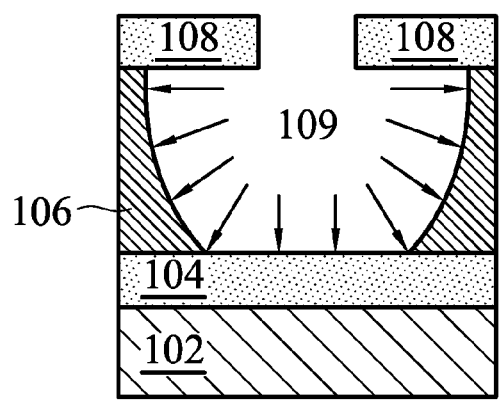

In FIG. 1D, the dielectric layer 106 is etched to form the opening 109 by wet etching using HF solution, for example. The space in the opening 109 can be formed by just wet etching in FIG. 1D, or can be formed in combination with the dry etching in FIG. 1C.

In some embodiments, the opening 109 has a bottom width that is 2-3 times of the opening 107 width of the top electrode layer 108, and the opening 109 bottom width ranges from 100 nm to 150 nm. Opening 109 may sometimes be referred to as a hollow cavity herein.

Figure 1E:
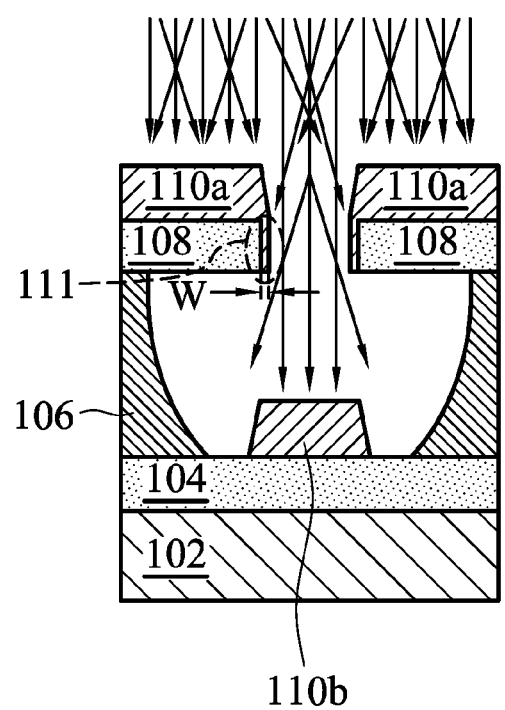

In FIG. 1E, MTJ layers 110a and 110b are deposited over the top electrode layer 108 and the bottom electrode layer 104 by physical vapor deposition (PVD), for example. MJT layers 110a and 110b are described as two layers because they are formed on different regions of the device, as shown in the figure. Note, however, that these two layers can be formed simultaneously using the same process in most embodiments. The MTJ layer 110b is formed in the opening 109 over the bottom electrode layer 104 and has a width ranging from 40 nm to 150 nm in some embodiments. The MTJ layer 110a is formed over the top electrode layer 108 at the same time. In some embodiments, the MTJ layers 110a and 110b has a thickness range from 250 Å to 300 Å.

The MTJ layers 110a and 110b include multiple layers, for example, a pinned layer comprising ferromagnetic material, a barrier layer comprising insulator material, and a free layer comprising ferromagnetic material. The ferromagnetic material comprises Co, Fe, NiFe, CoFe, or CoFeB, and the insulator material comprises $Al_2O_3$, MgO, $ZrO_2$, $Ta_2O_3$, $HfO_2$, NiO, or AlN in some embodiments. The free layer has its magnetization directions floating, while the pinned layer has its magnetization directions fixed.

Depending on the deposition angle, the MTJ layer 110b has a sidewall slope angle ranging from 80°-90°. The slope angle of the of the MTJ 110b can be controlled by the top electrode layer 108 thickness, the size of the opening 107 of the top electrode layer 108, and the deposition direction (shown by arrows).

In some embodiments, the MTJ layer 110b sidewall angle is 80°-87°, and there is also MTJ layer deposition 111 on the sidewall of the opening 107 of the top electrode layer 108 with a width w ranging from 10 Å to 50 Å.

Figure 1F:
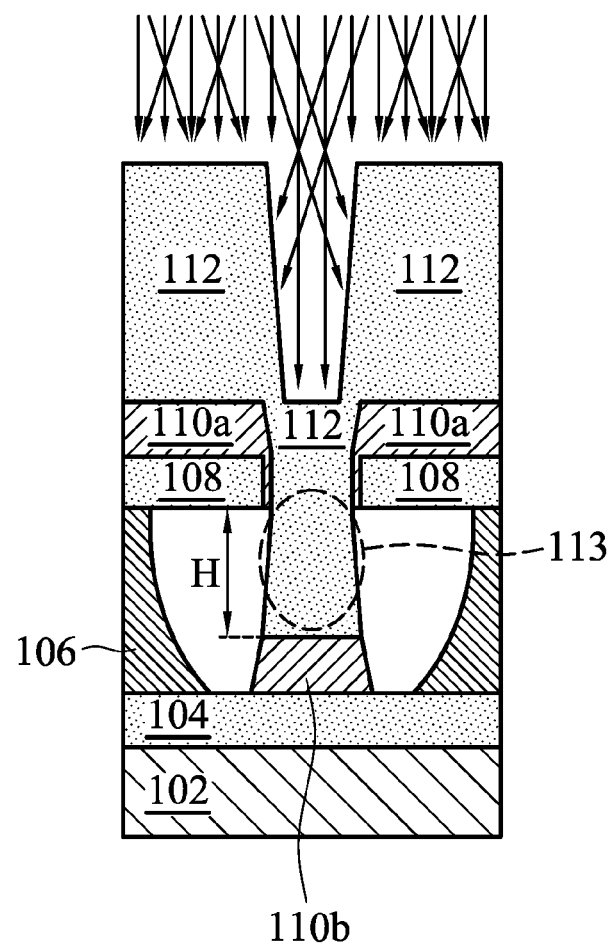

In FIG. 1F, a top electrode pillar 113 is deposited by PVD, for example. The top electrode pillar 113 is deposited as a part of another top electrode layer 112 deposition that has a thickness range from 300 Å to 400 Å in some embodiments. The top electrode pillar 113 comprises Ta in some embodiments, and has a height H ranging from 50 Å to 200 Å. The top electrode pillar 113 has a sidewall angle ranging from 80°-90°. In some embodiments, the top electrode pillar 113 sidewall angle is 80°-87°.

Figure 1G:
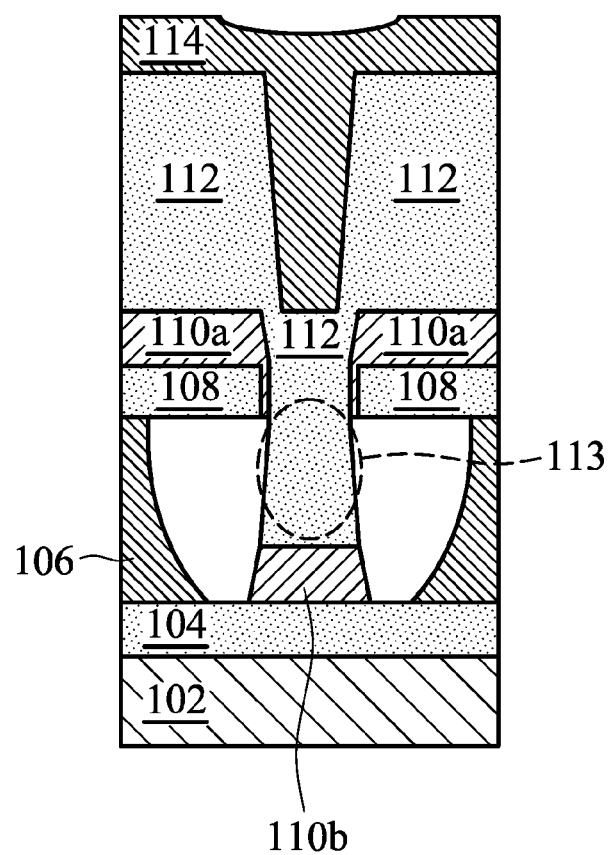

In FIG. 1G, another dielectric layer 114 is deposited over the top electrode layer 112 by chemical vapor deposition (CVD) or PVD, for example. The dielectric layer 114 can comprise $SiO_2$, SiN, or any other suitable material.

Figure 1H:
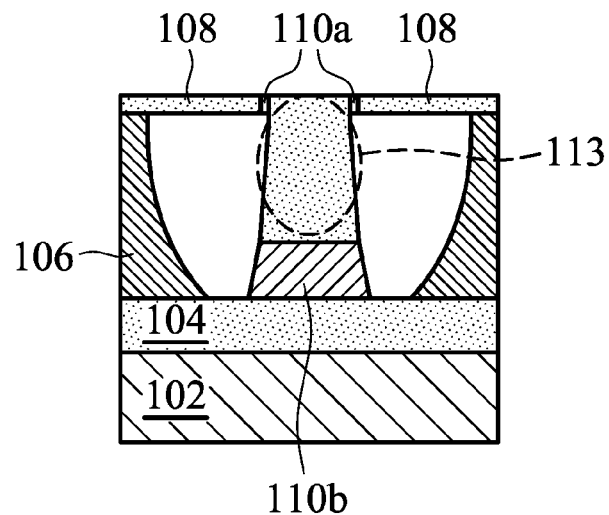

In FIG. 1H, a polishing process is performed to remove the layers above the bottom portion of the top electrode layer 108 by chemical mechanical polishing (CMP), for example. In some embodiments, the thickness of the remaining bottom portion of the top electrode layer 108 ranges from 50 Å to 100 Å. There are still portions of MTJ layer 110a remaining in some embodiments.

Figure 1I:
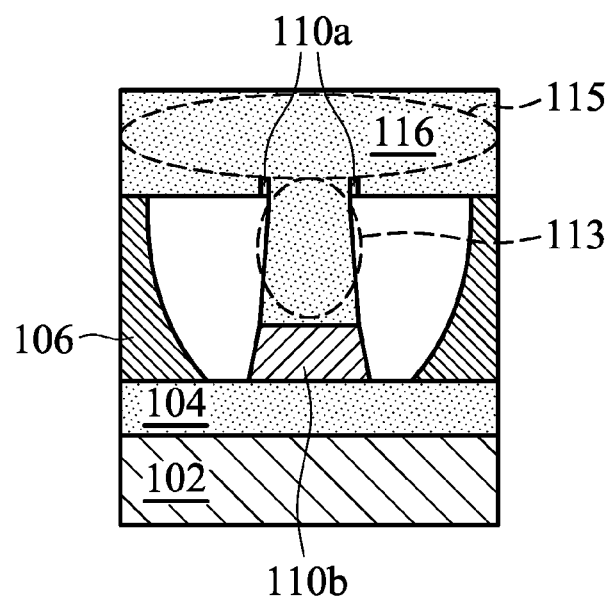

In FIG. 1I, another top electrode layer (e.g., Ta) is deposited over the remaining bottom portion of the top electrode layer 108 to form the top electrode 116. The top electrode 116 is T-shaped and includes a pillar portion 113 and a horizontal layer portion 115 in some embodiments. The remaining MTJ layer portion 110a at the corners of the pillar portion 113 and the horizontal layer portion 115 of the top electrode 116 has a width ranging from 10 Å to 50 Å with a thickness ranging from 50 Å to 100 Å in some embodiments.

Because the MTJ device fabrication method in FIGS. 1A-1I is performed by a casting approach (i.e., the structure shape is formed by filling in a space and removing unnecessary material), instead of a conventional approach (e.g., the structure shape is formed by photoresist patterning and removing material), there is reduced plasma damage and by-product on the MTJ layer 110b sidewall, and the MTJ layer 110b quality after the MTJ device formation can be kept the same as just after deposition of the MTJ layer 110b.

The deposition of the MTJ layer 110b and etching of the opening 109 space is determined by the opening 107 in the top electrode layer 108 in FIG. 1B, and the MTJ layer 110b shape and the opening 109 space can be controlled by the etching process with self-alignment. The opening 109 space has a U-shape in some embodiments.

Figure 2B:
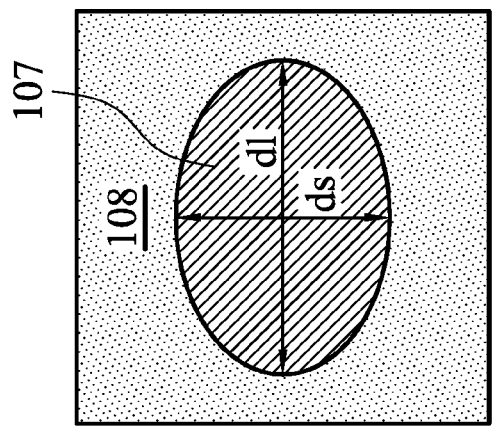
FIGS. 2A and 2B are top views of the exemplary MTJ device in FIG. 1B according to some embodiments.
Figure 2A:
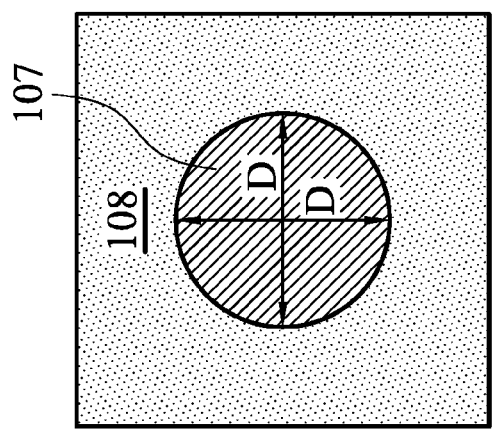

FIGS. 2A and 2B are top views of the exemplary MTJ device in FIG. 1B according to some embodiments. In FIG. 2A, the opening 107 in the top electrode layer 108 has a circular shape with a diameter D ranging from 40 nm to 50 nm in some embodiments. The resulting MTJ layer 110b in FIG. 1I will have a similar shape.

In FIG. 2B, the opening 107 in the top electrode layer 108 has an elliptic or oval shape with a long axis length dl ranging from 140 nm to 150 nm and a short axis length ds ranging from 40 nm to 50 nm. The resulting MTJ layer 110b in FIG. 1I will have a similar shape. In some other embodiments, the opening 107 and the MTJ layer 110b may have a different shape and/or size.

According to some embodiments, a method includes creating an opening in a dielectric layer that is disposed over a bottom electrode layer. A top electrode layer is disposed over the dielectric layer. A magnetic tunnel junction (MTJ) layer is formed in the opening over the bottom electrode layer.

According to some embodiments, a magnetic tunnel junction (MTJ) device includes a substrate, a bottom electrode layer disposed over the substrate, a MTJ layer disposed over the bottom electrode layer, and a top electrode disposed over the MTJ layer. The top electrode is T-shaped.

In an embodiment, a MTJ device is provided. The MTJ device includes a substrate, a bottom electrode disposed over the substrate, and a MTJ stack disposed over the bottom electrode. A top electrode is disposed over the MTJ stack, wherein the top electrode has a T-shape, the T-shape comprising a pillar and a cross member, the pillar being tapered.

In another embodiment, a MTJ device is provided. The MTJ device includes a substrate, a bottom electrode over the substrate, a dielectric layer on the bottom electrode, the dielectric layer having a void, the void having a first opening along a surface of the bottom electrode, and a MTJ stack on the bottom electrode in the first opening of the dielectric layer, the MTJ stack being spaced apart from sidewalls of the void. A top electrode is disposed over the dielectric layer, the top electrode comprising a pillar extending from a cross member, the pillar extending through a second opening of the void in the dielectric layer, the pillar extending to the MTJ stack.

In another embodiment, a MTJ device is provided. The MTJ device includes a substrate, a bottom electrode over the substrate, a dielectric layer over the bottom electrode, and a top electrode over the dielectric layer, the dielectric layer having an opening extending between the bottom electrode and the top electrode, the top electrode extending over the opening, the top electrode comprising a pillar and a cross member, the pillar extending into the opening. A MTJ stack is disposed on the bottom electrode within the opening, sidewalls of the MTJ stack being spaced apart from sidewalls of the opening, wherein the pillar of the top electrode is electrically coupled to the MTJ stack.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A magnetic tunnel junction (MTJ) device comprising:
   a substrate;
   a bottom electrode disposed over the substrate;
   a MTJ stack disposed over the bottom electrode;
   a top electrode disposed over the MTJ stack, wherein the top electrode has a T-shape, the T-shape comprising a pillar and a cross member, a portion of the pillar most proximate to the MTJ stack having a greater width than a portion of the pillar most distal from the MTJ stack; and
   a material similar to material included in the MTJ stack disposed at corners of the top electrode, the corners being located at junctions of the pillar and the cross member of the top electrode.

2. The MTJ device of claim 1, wherein the pillar has a sidewall angle ranging from 80 degrees to 87 degrees.

3. The MTJ device of claim 1, further comprising a dielectric layer over the bottom electrode, the dielectric layer having a void, wherein the MTJ stack is within the void.

4. The MTJ device of claim 3, wherein the top electrode extends over the void in the dielectric layer.

5. The MTJ device of claim 3, wherein the void in the dielectric layer exposes the bottom electrode.

6. The MTJ device of claim 3, wherein the pillar extends downward into the void.

7. The MTJ device of claim 1, wherein the MTJ stack has a circular, elliptical, or oval shape in a top view.

8. The MTJ device of claim 1, wherein sidewalls of the pillar are inwardly concave.

9. A magnetic tunnel junction (MTJ) device comprising:
a substrate;
a bottom electrode over the substrate;
a dielectric layer on the bottom electrode, the dielectric layer having a void, the void having a first opening along a surface of the bottom electrode;
a MTJ stack on the bottom electrode in the first opening of the dielectric layer, the MTJ stack being spaced apart from sidewalls of the void; and
a top electrode disposed over the dielectric layer, the top electrode comprising a pillar extending from a cross member, the pillar extending through a second opening of the void in the dielectric layer, the pillar extending to the MTJ stack.

10. The MTJ device of claim 9, wherein the pillar has tapered sidewalls.

11. The MTJ device of claim 9, wherein a width of the pillar adjacent the cross member is less than a width of the pillar adjacent the MTJ stack.

12. The MTJ device of claim 9, further comprising a MTJ deposition at an intersection of the pillar and the cross member.

13. The MTJ device of claim 9, wherein the void extends around sidewalls of the MTJ stack.

14. The MTJ device of claim 9, wherein a width of the void along the bottom electrode is less than a width of the void along the tope electrode.

15. A magnetic tunnel junction (MTJ) device comprising:
a substrate;
a bottom electrode over the substrate;
a dielectric layer over the bottom electrode;
a top electrode over the dielectric layer, the dielectric layer having an opening extending between the bottom electrode and the top electrode, the top electrode extending over the opening, the top electrode comprising a pillar and a cross member, the pillar extending into the opening; and
a MTJ stack on the bottom electrode within the opening, sidewalls of the MTJ stack being spaced apart from sidewalls of the opening, wherein the pillar of the top electrode is electrically coupled to the MTJ stack.

16. The MTJ device of claim 15, further comprising a MTJ deposition at an intersection of the pillar and the cross member of the top electrode.

17. The MTJ device of claim 16, wherein the opening along the bottom electrode is between 2 and 3 times a sum of a width of the pillar at the intersection of the pillar and the cross member and a width of the MTJ deposition.

18. The MTJ device of claim 15, wherein a sidewall of the MTJ stack has a sidewall angle between 80 degrees and 87 degrees.

19. The MTJ device of claim 15, wherein a sidewall of the pillar has a sidewall angle between 80 degrees and 90 degrees.

20. The MTJ device of claim 15, wherein the dielectric layer has a thickness of between 300 Å and 400 Å.

* * * * *